United States Patent [19]

Go

[11] Patent Number: 5,127,071
[45] Date of Patent: Jun. 30, 1992

[54] OPTICAL MODULE INCLUDING RECEPTACLE, AND METHOD OF PRODUCING THE SAME

[75] Inventor: Hisao Go, Kanagawa, Japan

[73] Assignee: Sumitomo Electric Industries, Ltd., Osaka, Japan

[21] Appl. No.: 667,301

[22] Filed: Mar. 12, 1991

[30] Foreign Application Priority Data

Mar. 13, 1990 [JP] Japan ................... 2-61920
Mar. 13, 1990 [JP] Japan ................... 2-61921

[51] Int. Cl.⁵ .................... G02B 6/00; G02B 6/36
[52] U.S. Cl. .................................................. 385/73
[58] Field of Search ............. 350/96.18–96.21, 350/96.24

[56] References Cited

U.S. PATENT DOCUMENTS

| | | | |
|---|---|---|---|
| 4,116,532 | 9/1978 | Hubbard et al. | 350/96.21 |
| 4,136,357 | 1/1979 | Frederiksen | 357/72 |
| 4,410,469 | 10/1983 | Katagiri et al. | 350/96.17 X |
| 4,730,198 | 3/1988 | Brown et al. | 350/96.20 |
| 4,744,626 | 5/1988 | Mery | 350/96.20 |
| 4,803,361 | 2/1989 | Aiki et al. | 250/227 |
| 4,820,013 | 4/1989 | Fuse | 350/96.27 |
| 4,827,118 | 5/1989 | Shibata et al. | 250/211 J |
| 4,834,491 | 5/1989 | Aoki et al. | 357/17 |
| 4,868,640 | 9/1989 | Shine | 357/75 |
| 4,961,107 | 10/1990 | Geist et al. | 357/81 |
| 4,977,442 | 12/1990 | Suzuki et al. | 357/81 |

FOREIGN PATENT DOCUMENTS

| | | |
|---|---|---|
| 0183857 | 6/1986 | European Pat. Off. . |
| 0273364 | 7/1988 | European Pat. Off. . |
| 58-4952 | 1/1983 | Japan . |
| 59-119774 | 7/1984 | Japan . |
| 59-205775 | 11/1984 | Japan . |
| 8810441 | 12/1988 | PCT Int'l Appl. . |
| 9000753 | 1/1990 | PCT Int'l Appl. . |
| 9004799 | 5/1990 | PCT Int'l Appl. . |
| 630760 | 6/1982 | Switzerland . |
| 2126795 | 3/1984 | United Kingdom . |

*Primary Examiner*—Akm E. Ullah
*Attorney, Agent, or Firm*—Cushman, Darby & Cushman

[57] ABSTRACT

An optical module comprises at least one optical sub-module having at least one optical connector for receiving an end portion of an optical fiber at an end portion of the optical connector so as to optically couple the end portion of the optical fiber with an optical operation element, and a molded resin member for holding the optical connector except for the end portion of the optical connector; and at least one receptacle for enveloping the end portion of the optical connector to integrally hold the optical sub-module, the receptacle having an opening portion for fitting with an optical plug holding the end portion of the optical fiber which is to be received by the optical connector. The receptacle is resin-molded by using a mold die including a core for forming an opening portion of the optical module, the core having at least one hold portion for holding a portion of the optical sub-module.

20 Claims, 11 Drawing Sheets

OPTICAL MODULE INCLUDING RECEPTACLE, AND METHOD OF PRODUCING THE SAME

RELATED APPLICATIONS

This application is directed to subject matter that is generally related to the subject matter disclosed in the following U.S. applications:
1) U.S. application Ser. No. 07/573,583;
2) U.S. application Ser. No. 07/670,421; and
3) U.S. application Ser. No. 07/588,990.

BACKGROUND OF THE INVENTION

The present invention relates to an optical module for use in an optical communication system using light as an information transmitting medium, such as data link, optical LAN, and so on, and a method of producing the same. In the following description, the optical module comprises at least one sub-module having at least one optical connector, which is fitted in a ferrule of an optical plug and to which an optical operation element (light emitting element or light receiving element) is fixed, and at least one receptacle fitted to the optical plug to prevent the plug from falling off.

Conventionally, an optical module having a plurality of optical connectors (a multi-core optical module) has been produced in such a manner that after single-core optical sub-modules each for optically coupling an optical operation element and an optical fiber with each other have been produced, plural ones of the thus produced single-core optical sub-modules are combined.

Those single-core optical sub-modules may be classified into two, one being a transmitting module using a light emitting element such as a light emitting diode as an optical operation element, the other being a receiving module using a light receiving element such as a pin photo-diode as an optical operation element.

Figure 1:
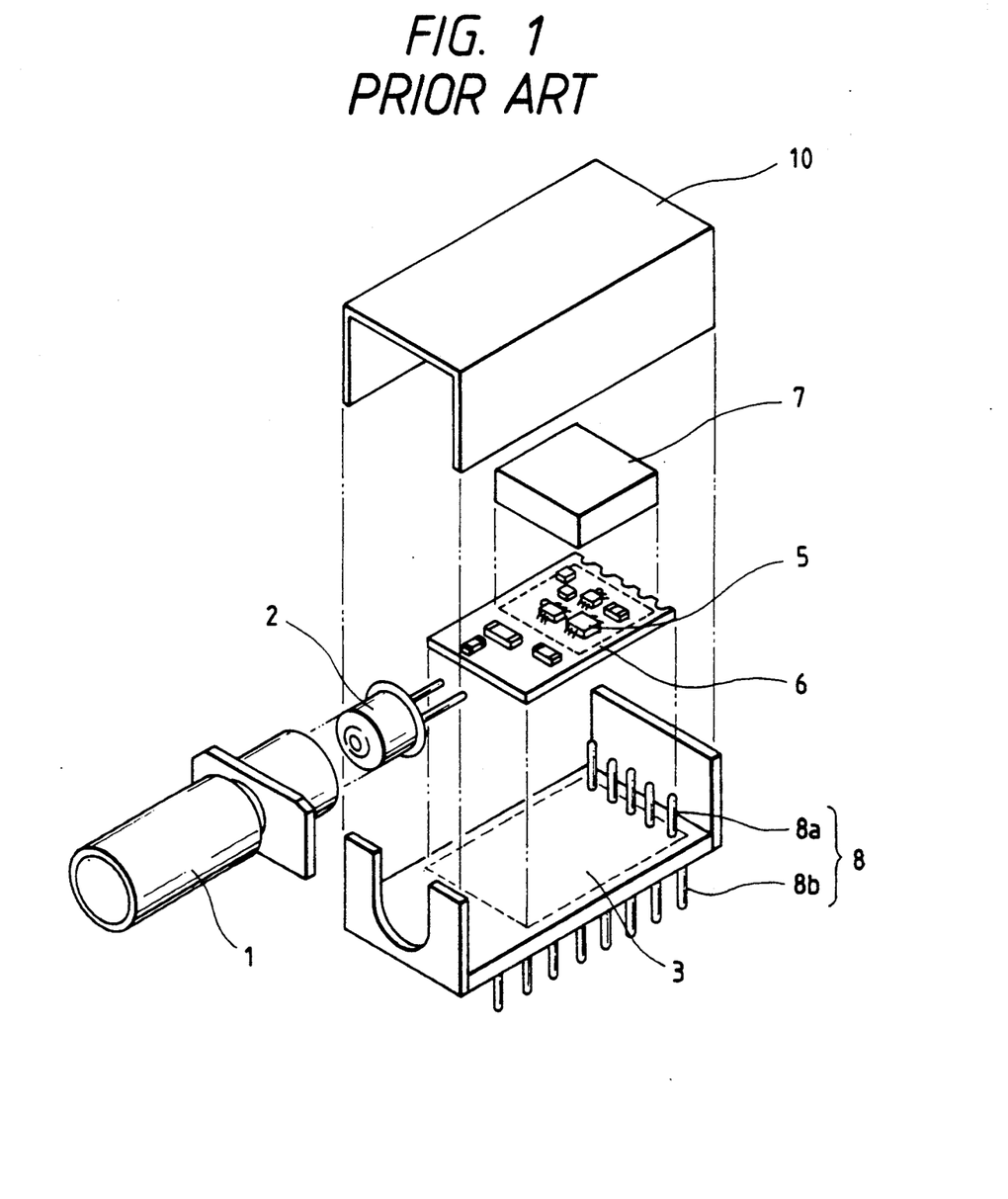
FIG. 1 is an exploded diagram illustrating a conventional single-core optical sub-module.

FIG. 1 shows an example of the structure of a conventional single-core optical sub-module. As shown in FIG. 1, in the conventional single-core optical sub-module, an optical operation element (light emitting or light receiving element) 2 is fixed by an adhesive or the like to an optical connector 1 to be fitted in a ferrule (not shown) which is fixed to an end portion of an optical fiber (not shown), after adjusting its optical axis. The optical connector 1 to which the optical operation element 2 is fixed, is fixed to a ceramic package 3 by an adhesive agent or the like. To the ceramic package 3, in addition to the optical connector 1, fixed is a substrate 6 supporting an electronic circuit portion constituted by electronic circuit parts such as a bare chip IC 5 and so on. The bare chip IC 5 and the like mounted on the substrate 6 together with wires connecting them to a wiring pattern on the substrate 6 are sealed by a lid 7 made of kovar etc. In addition, in the ceramic package 3, provided are lead pins 8 constituted by inner leads 8a and outer leads 8b respectively erected from the inner and outer sides of the package. After the inner leads 8a and the electronic circuit portion on the substrate 6 are electrically connected with each other and the electronic circuit portion and terminals of the optical operation element 2 are also electrically connected with each respectively by wire bonding or the like, a cover 10 is fixed to the ceramic package 3 to thereby constitute a single-core optical sub-module.

Figure 2:
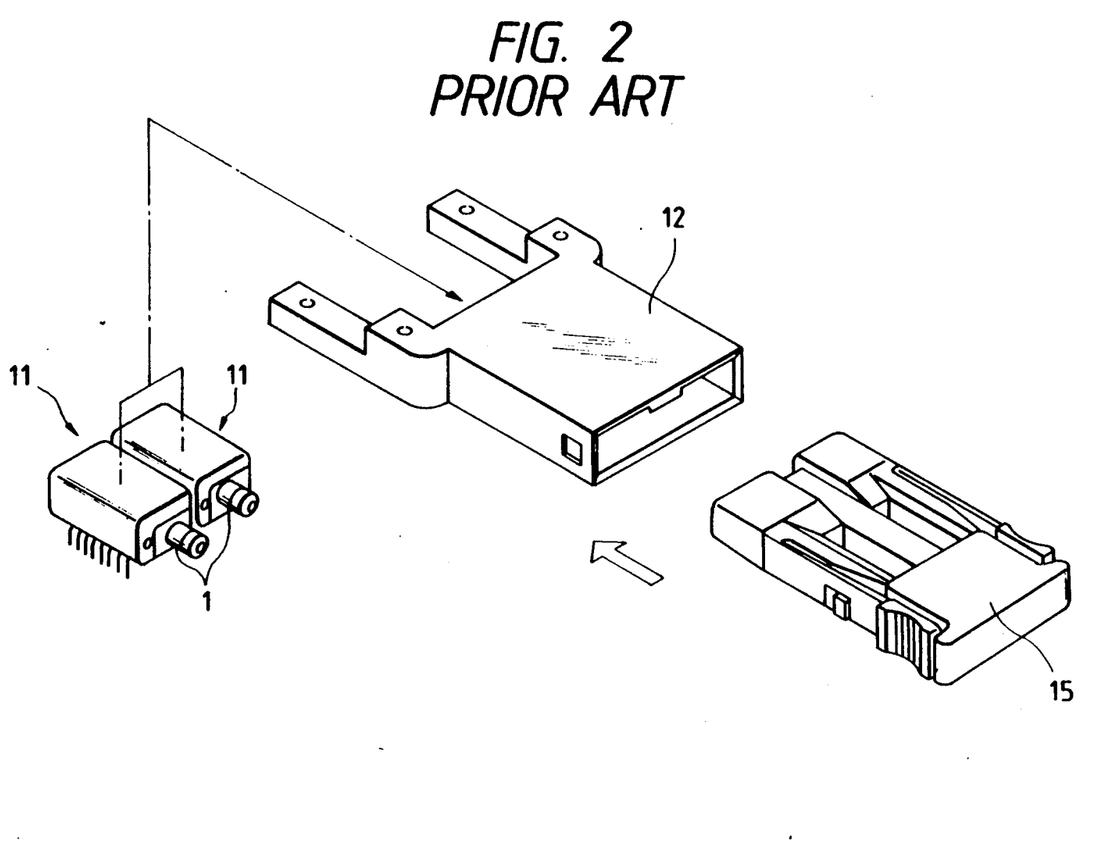
FIGS. 2 and 3 are diagrams illustrating a conventional multi-core optical module and an aligning tool.
Figure 3:
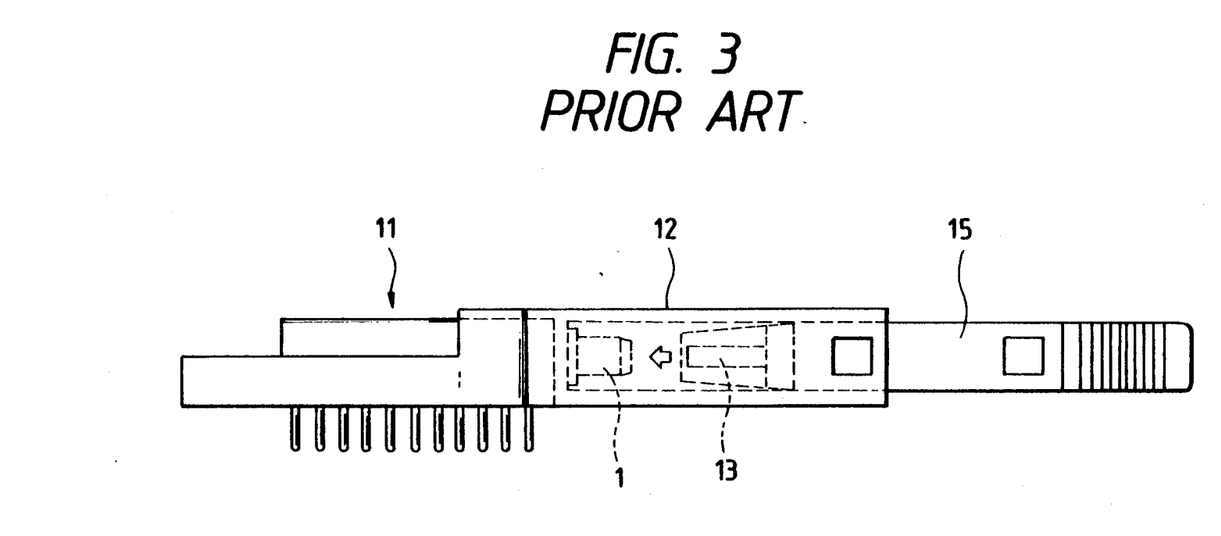

A plurality of single-core optical sub-modules 11 constituted as described above are assembled to a receptacle 12 as shown in FIGS. 2 and 3 to thereby form a conventional multi-core optical module.

However, the single-core optical sub-module is, as described above, constituted by a number of parts and made up by assembling the respective constituent parts one by one. Therefore, the process of assembling has been complicated and the number of steps required therefor has been large. In addition, since expensive material such as ceramic and so on has been used, reduction of cost or mass-production of the single optical sub-modules has been difficult. In such a circumstance, it has been also difficult to reduce the cost of or to perform mass-production of multi-core optical modules which are constituted by combining a plurality of such single-core optical sub-modules.

In addition, a multi-core optical module is attached/detached to/from a multi-core plug having a plurality of ferrules 13 in the receptacle 12 in practical use, and, therefore, a high positioning accuracy is required in attaching the single-core optical sub-modules 11 to the receptacle 12.

That is, if the positioning accuracy is insufficient, smooth attachment/detachment will be impossible, and in the worst case, abrasion or breakage of the ferrules 13 or the optical connectors 1 will be caused. Conventionally, it has been therefore necessary that the assembling portions of the single-core optical module 11 and the receptacle 12, at which the module 11 is coupled to the receptacle 12, are formed with high dimensional accuracy, and when they are assembled with each other, an alignment tool 15 having aligning ferrules 13, the number of which is the same as that of the optical connectors to be provided in a multi-core optical module to be produced, has been used as shown in FIGS. 2 and 3 to thereby perform accurate positioning. Therefore, together with the reason that the multi-core optical module is constructed by combining single-core optical sub-modules which are difficult to be reduced in their price and to be produced through mass production, it has been very difficult to reduce the price of the multi-core optical modules or to produce them through mass production.

Figure 4:
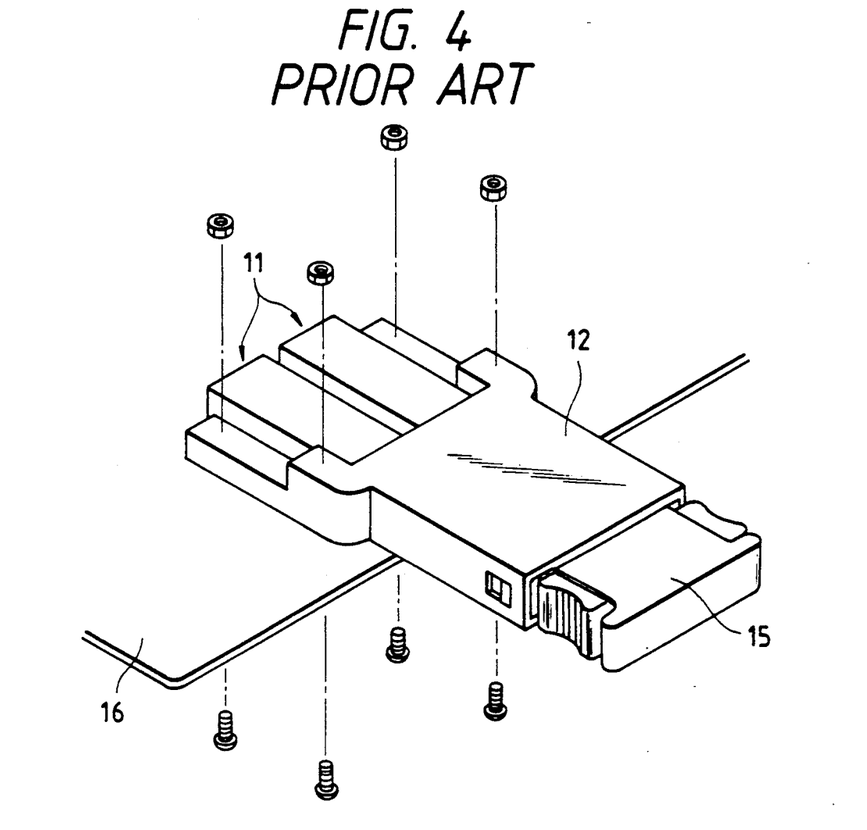
FIG. 4 is a diagram illustrating a process to mount a conventional multi-core optical module on a printed circuit board.

In addition, as shown in FIG. 4, when a multi-core optical module which has been formed through accurate positioning in the above-mentioned manner, is mounted on a printed circuit board 16 by screwing, solder reflowing, or the like, there is a case where the relative positional relationship between the single-core optical sub-modules constituting the multi-core optical module or between the receptacle 12 and each of the single-core optical sub-modules becomes wrong. To prevent this, the expensive aligning tool 15 must be left in such a state that it is attached to the multi-core optical module until the mounting of the multi-core optical module is finished. Accordingly, the workability in mounting has been poor.

SUMMARY OF THE INVENTION

It is therefore an object of the present invention to solve the foregoing problems and to make it possible to provide an optical module at a low price through mass production. It is another object of the present invention to provide an optical module having superior workability in mounting.

In order to attain the foregoing objects, according to the present invention, at least one optical connector is held by a molded resin member except for an end portion thereof at which an end portion of an optical fiber is to be received, to thereby form an optical sub-module, and at least one optical sub-module is integrally held by a receptacle having an opening portion to be fitted with an optical plug which holds the end portion of the optical fiber.

According to the above configuration it is possible to reduce the number of parts constituting the optical module.

The optical module according to the present invention is formed by using a mold die for resin molding. The mold die includes a core for forming the opening portion of the receptacle, the core having at least one hold portion holding the end portion of the optical connector.

By using the mold die, the relative positional accuracy between the opening portion of the receptacle and the optical connector can be improved since the accuracy is determined by the dimensional accuracy realized in the mold die.

DETAILED DESCRIPTION OF THE PREFERRED EMBODIMENTS

A first embodiment of the present invention will be described with reference to FIGS. 5 to 10.

Figure 5:
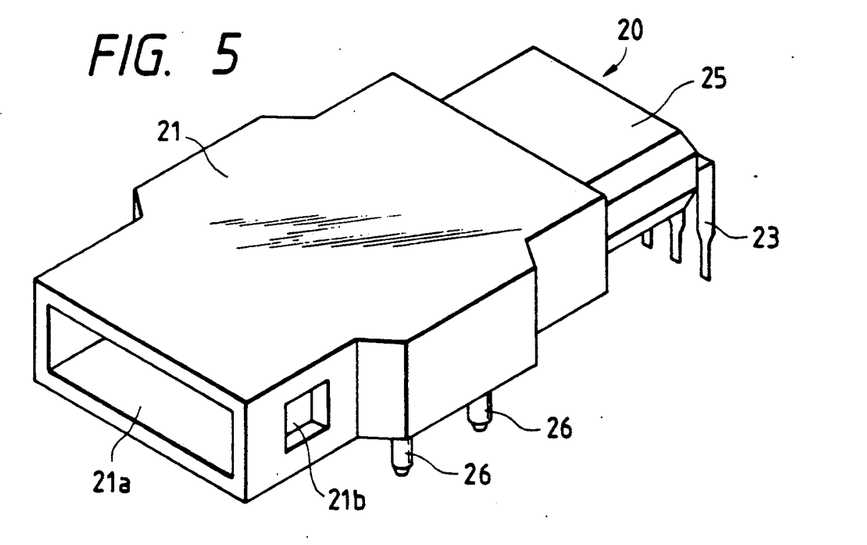
FIG. 5 is a perspective view illustrating a multi-core optical module according to a first embodiment of the present invention applied to a two-core light transmitting/receiving module.
Figure 6:
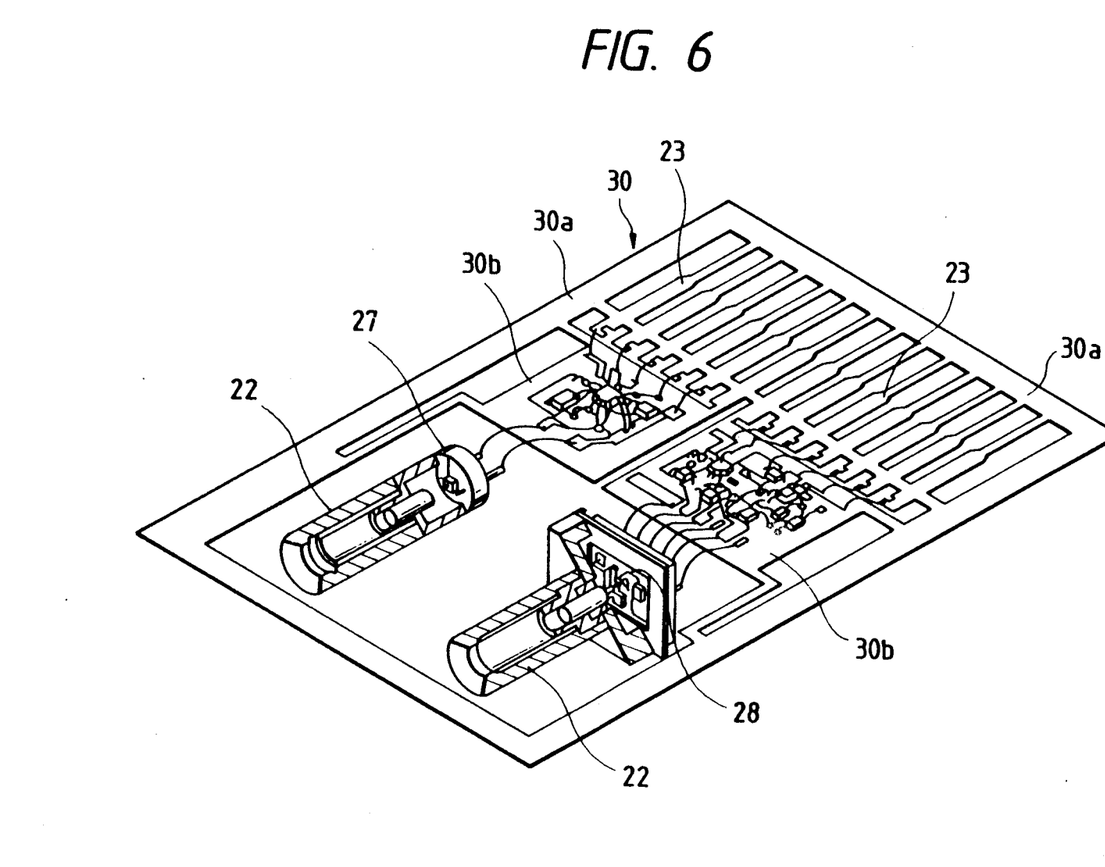
FIG. 6 is a partially sectional perspective view illustrating a state of parts constituting a two-core optical sub-module before being resin-molded.
Figure 7:
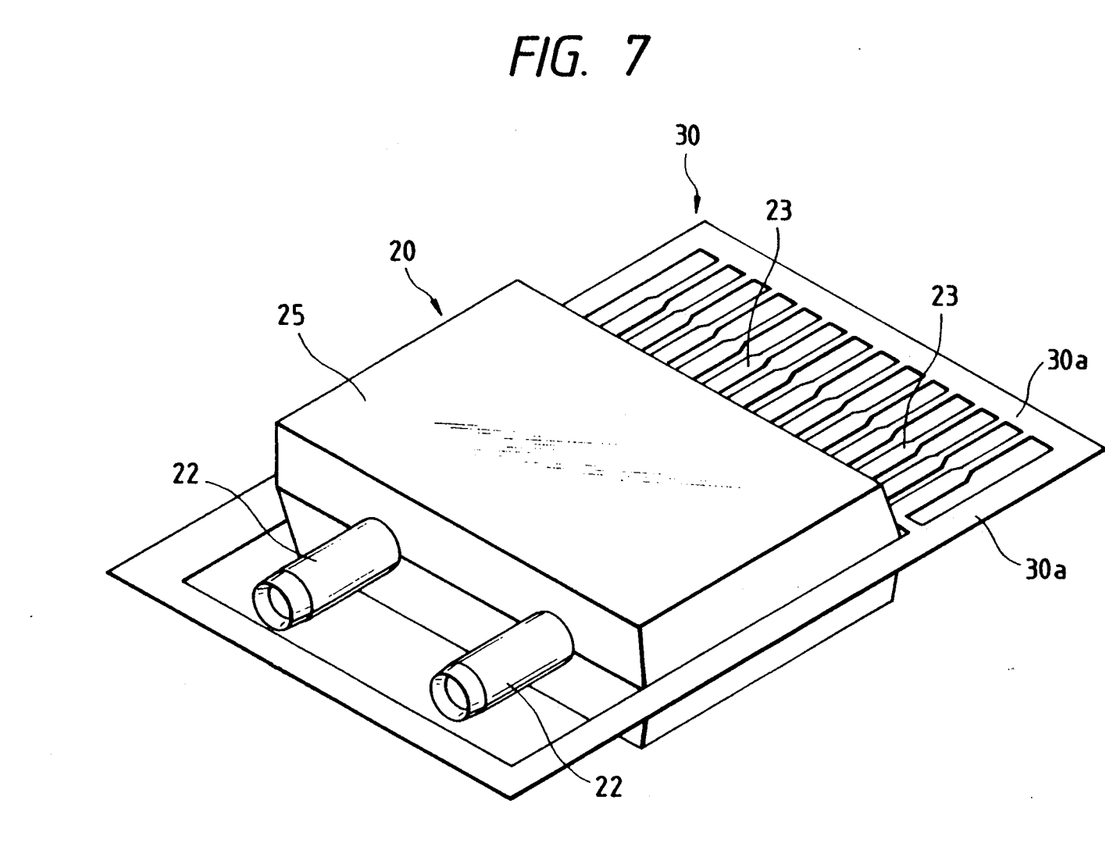
FIG. 7 is a perspective view illustrating a state of parts constituting a two-core optical sub-module after being resin-molded.
Figure 8:
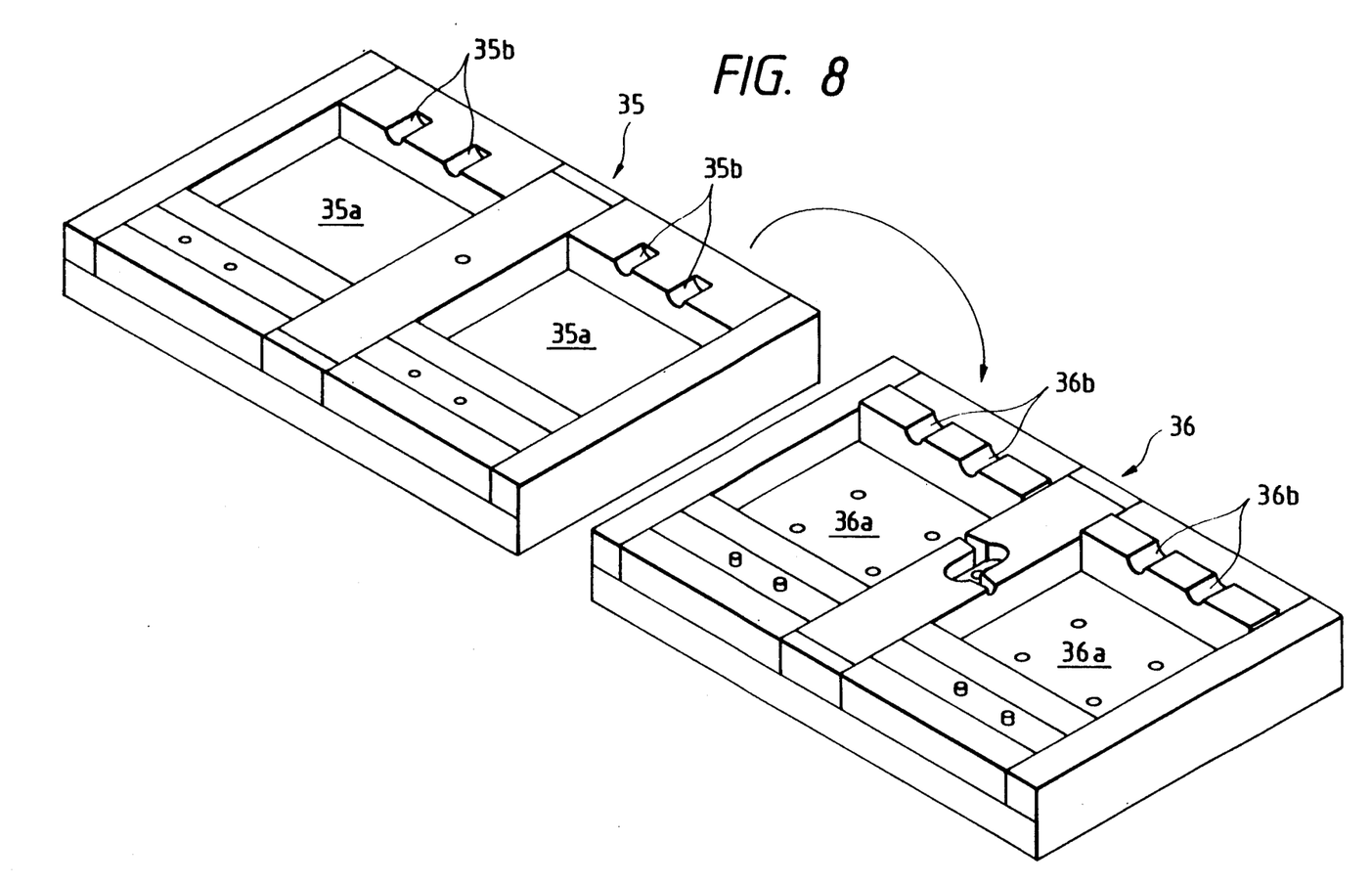
FIG. 8 is a perspective view illustrating a mold die used for producing a two-core sub-module.

FIG. 5 shows a multi-core optical module according to the first embodiment of the present invention when applied to a two-core light transmitting/receiving module. In the illustrated two-core light transmitting-/receiving module, a two-core optical sub-module 20 having two optical connectors is formed so as to be integrally held by a receptacle 21 of mold resin. As also shown in FIGS. 6 to 8, the parts constituting the two-core optical sub-module 20, such as optical connectors 22, lead pins 23 etc., are integrally held by a molded resin member 25 of mold resin to thereby form the two-core optical sub-module 20. The optical connectors 22 are held by the molded resin member 25 so that their end portions at which optical fibers (not-shown) are to be received, are projected outside, and the two-core optical sub-module 20 is integrally held by the receptacle 21 so that the end portions of the optical connectors 22 are enveloped in the receptacle 21. In the two-core optical sub-module 20 of the illustrated embodiment, a light emitting element is fixed to one of the two optical connectors and a light receiving element is fixed to the other optical connector. However, in the present invention, the multi-core optical sub-module may have only light emitting elements or only light receiving elements.

In the receptacle 21, an opening portion 21a is formed so as to open at the side thereof opposite to the side at which the two-core optical sub-module 20 is held. End portions of two optical fibers are held by an optical plug which is to be fitted into the opening portion 21a. Therefore, when the optical plug is inserted and fitted into the opening portion 21a, the optical fiber end portions are received by the end portions of the optical connectors 22 enveloped by the receptacle 21 so that the optical fiber end portions are optically coupled with the optical operation elements respectively fixed to the optical connectors 22. Latch holes 21b are opened in the portions aside the opening portion 21a, and when the optical plug is fitted into the opening portion 21a, elastic projections formed in the side portions of the optical plug are engaged thereto, so that the optical plug is held so as not to be detached from the receptacle 21. In the receptacle 21, integrally held are stud pins 26 for fixing the receptacle 21 to a printed circuit board or the like.

Next, a process of producing the two core light transmitting/receiving module shown in FIG. 5 will be described with reference to FIGS. 6 to 10.

FIG. 6 shows a state of the constituent parts such as optical connectors 22 constituting the two-core optical sub-module 20 before resin molding, and FIG. 7 shows a state of the constituent parts such as optical connectors 22 constituting the two-core optical sub-module 20 after resin molding.

The above-mentioned two-core optical module is produced in such a manner that the two-core optical sub-module 20 is produced and then the receptacle 21 is produced with the two-core optical sub-module 20 as an insert part. The two-core optical sub-module 20 is produced, for example, in a manner as follows.

First, as shown in FIG. 6, a light emitting diode 27 and a photo-diode 28 are respectively fixed to the optical connectors 22 by welding or the like after adjusting their optical axis.

Next, a lead frame 30 is prepared. The lead frame 30 is constituted by lead pins 23, a frame portion 30a for supporting those pins, and a substrate portion 30b supported by those parts. An insulating film of alumina ($Al_2O_3$) or the like is formed on the surface of the substrate portion 30b of the lead frame, and a conductive wiring pattern including a bonding pad, being made of aluminum or the like, is formed on the insulating film. On the substrate portion 30b on which the wiring pattern is formed, electronic circuit parts such as a bare chip IC etc. are mounted, and the electronic circuit parts are connected with the wiring pattern by wire bonding, thereby constituting an electronic circuit. After mounting the electronic circuit parts on the substrate portion 30b, the optical operation elements (the light emitting diode 27 and the photo-diode 28) fixed to the optical connectors 22 and the lead pins 23 are connected to the electronic circuit by wires.

After attaching the constituent parts of the two-core optical sub-module 20 to the lead frame 30 in such a manner as above, those parts such as the lead frame 30 are put, as they are, into a transfer molding mold die which will be described later, and molding resin is poured into this mold die, so that the parts, except for end portions of the optical connectors and parts of the lead pins as outer leads, are integrally held by the molding resin to thereby form the two-core optical sub-module 20 as shown in FIG. 7. As the molding resin to be poured into the mold die, it is preferable to use polyphenylene-sulfide (PPS) or epoxy resin having a high dimensional stability.

FIG. 8 shows an example of the transfer molding mold die by which the two-core optical sub-modules can be formed at the same time. As illustrated, the mold die is constituted by an upper mold 35 and a lower mold 36. In the surfaces of the upper and lower molds 35 and 36 opposite to each other, two cavities 35a and 36a are formed respectively and a pair of semi-cylindrical recess portions 35b and 36b are formed so as to communicate with the respective cavities. When the parts such as the lead frames 30 are inserted between the upper and lower molds 35 and 36 so as to be attached into the mold die, the end portions of the optical connectors 22 for receiving optical fiber end portions are to be fitted tightly into these recess portions 35b and 36b. That is, the pair of optical connectors 22 are fitted into the recess portions 35b and 36b so that the positional relationship between the optical connectors 22 relative to each other can be determined accurately. The technical level of producing the mold dies has reached the degree which makes it possible to realize a very high dimensional accuracy, so that the dimensional accuracy and so on required between the pair of optical connectors 22 provided in the two-core optical sub-module 20 can be sufficiently satisfied.

Therefore, if the recess portions 35b and 36b are formed with the dimensional accuracy required for the relative positional relationship and so on between the pair of optical connectors 22 provided in the two-core optical sub-module 20, the two-core optical sub-module 20 with a high dimensional accuracy can be produced by fitting the parts such as the lead frame 30 into the mold die and by pouring molding resin into the cavities in the mold die to perform molding.

By producing the two-core optical sub-module in such a manner as described above, it is possible to omit the conventional process of once producing single-core optical sub-modules and then combining the thus prepared single core optical sub-modules to thereby produce the multi-core optical module.

In addition, the molding resin molded by transfer molding has a high sealing property because of being formed under a high pressure in the same manner as in the general case of sealing an IC or the like. It is therefore unnecessary to use a lid or cover which has been conventionally used for sealing a bare chip IC and so on in producing single-core optical sub-modules. Further since packaging can be performed with resin which is more inexpensive than ceramics or the like which has been used in a conventional package, it is possible to reduce the packaging cost in a large degree.

After the two-core optical sub-module 20 is resin molded in the above-mentioned manner, unnecessary parts of the lead frame 30 are cut off by a press machine or the like, the two-core optical sub-module 20 is fitted as an insert part into a mold die for forming a receptacle which will be described later, molding resin is poured into this mold die for molding a receptacle to thereby form the receptacle 21 integrally holding the two-core optical sub-module 20, and a two-core light transmitting/receiving module as shown in FIG. 5 is completed.

Figure 9:
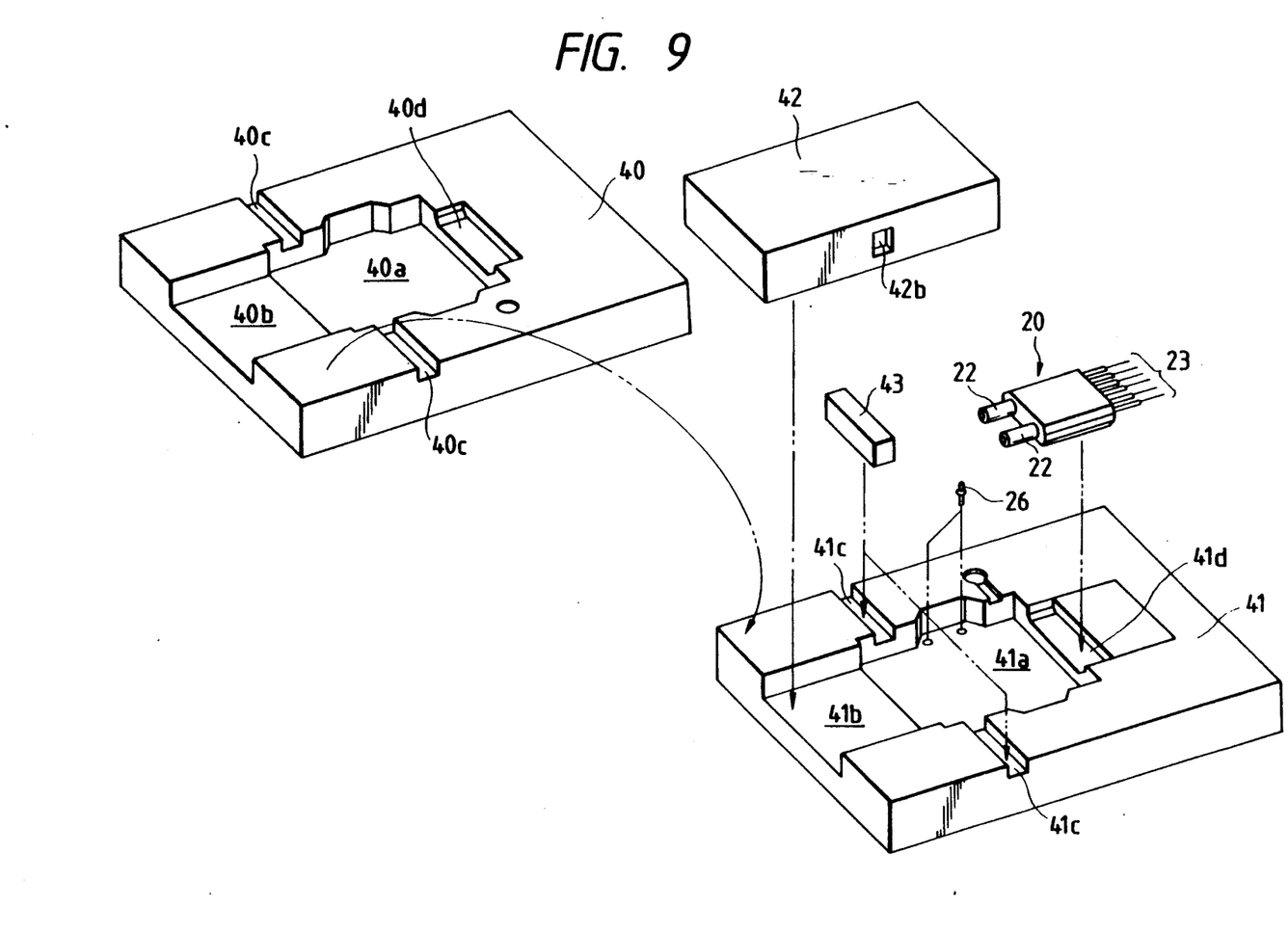
FIG. 9 is an exploded diagram illustrating a mold die for forming a receptacle used for producing a two-core light transmitting/receiving module.
Figure 10A:
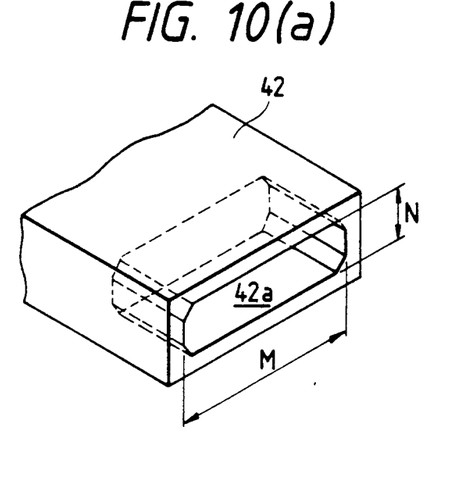
FIGS. 10(a) and 10(b) are perspective views illustrating a part of a core of the mold die shown in FIG. 9 for forming a receptacle opening portion.

FIG. 9 shows an example of the mold die for molding the receptacle. As illustrated, this mold die is constituted by upper and lower molds 40 and 41; there are provided a core 42 for forming the opening portion, and two cores 43 for forming latch holes. In the upper and lower molds 40 and 41, there are provided recess portions 40a and 41a for forming the outer shape of the receptacle 21, core holding portions 40b and 41b into which the core 42 is fitted slidably, core holding portions 40c and 41c into which the cores 43 are fitted slidably, and recess portions 40d and 41d for receiving the two-core optical sub-module 20. The recess portions 40d and 41d are formed so as to be continuous to the recess portions 40a and 41a. The core 42 is fitted into the core holding portions 40b and 41b so as to be held between the upper and lower molds 40 and 41, and the core projects into a cavity formed by the recess portions 40a and 41a of the upper and lower molds to thereby form the inner shape of the receptacle 21. Further, as shown in FIG. 10(a), a fitting recess portion 42a is formed in a top end portion of the core 42 projecting into the cavity, so that the fitting recess portion 42a is tightly fitted with the two-core optical sub-module 20 in the state that the end portions of the optical connectors 22 provided in the two-core optical sub-module 20 are enveloped. On the other hand, the cores 43 are fitted into the core holding portions 40c and 41c so as to be engaged with the recess portions 42b formed in the side portions of the core 42 to thereby form the latch holes 21b of the receptacle 21.

The stud pins 26 and the two-core optical sub-module 20 as insert parts are fitted into such a mold die for forming a receptacle, and molding resin is poured into the mold die, to thereby form the receptacle 21 to integrally hold the two-core optical sub-module 20. Accordingly, it is possible to produce a two-core light transmitting/receiving module with a high dimensional accuracy. The lead pins 23 provided in the two-core optical sub-module 20 are bent into a predetermined shape after the resin molding. Consequently, such a two-core light transmitting/receiving module as shown in FIG. 5 is completed.

Figure 10B:
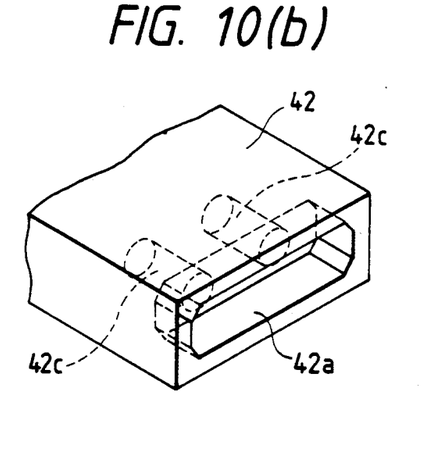

In the above-mentioned example, the fitting recess portion 42a in which the two-core optical sub-module 20 is to be tightly fitted, is formed in the core 42 so as to make this core 42 have a function to determine the relative positional relationship between the opening portion 21a of the receptacle and the optical connectors 22. Therefore, the dimensional accuracy of the relative positional relationship between the opening portion 21a of the receptacle and the optical connectors 22 is determined by the dimensional accuracy of the fitting recess portion 42a and the outer dimensional accuracy of two-core optical sub-module 20. Since the two-core optical sub- module 20 having a high outer dimensional accuracy can be obtained in the above-mentioned manner, after all, the dimensional accuracy of the above relative positional relationship can be determined by the dimensional accuracy in producing the core. Accordingly, if the sizes M and N of the fitting recess portion 42a shown in FIG. 10(a) are made close to the outer size of the two-core optical sub-module 20, it is possible to improve the relative positional accuracy between the receptacle opening portion 21a and the optical connectors 22 provided in the two-core optical sub-module 20. In addition, as shown in FIG. 10(b), when a pair of fitting holes 42c which are tightly fitted to the outside of the optical connectors 22, are formed with a high dimensional accuracy in the interior of the fitting recess portion 42a, it is possible to further improve the relative positional accuracy between the receptacle opening portion 2aa and the optical connectors 22 provided in the two-core optical sub- module 20.

As in the case of the above-mentioned mold die for forming the two-core optical sub-module 20, also the technical level of producing the mold die including the core 42 and so on has reached the degree which makes it possible to realize a very high dimensional accuracy, so that the dimensional accuracy required in the relative positional relationship between the receptacle 21 and the optical connectors 22 is sufficiently satisfied. Therefore, without using such an aligning tool as used conventionally, it is possible to mass-produce two-core light transmitting/receiving modules with a high dimensional accuracy in their finished state with superior reproducibility, through the above-mentioned resin molding. Additionally, the conventional troublesome working of alignment with an expensive aligning tool is unnecessary when a multi-core optical module is mounted on a fixed object such as a printed circuit board. That is, it is possible to easily mount the multi-core optical module as it is on the fixed object such as a printed circuit board.

As has been described, according to the first embodiment of the present invention, in addition to eliminating the necessity that single-core optical sub-modules which are expensive and have a low mass-productivity, are combined to constitute a multi-core optical module as conventionally performed, it is possible to simplify the process of assembling the constituent parts. Moreover, since the configuration is made such that the constituent parts are integrally held by inexpensive molding resin which is to be formed by transfer molding or the like, it is possible to form a number of multi-core optical modules at the same time, resulting in a superior mass productivity. It is therefore possible to provide a plurality of multi-core optical modules at a low cost.

Further, according to the present invention, the assembling positional accuracy of the optical connectors relative to each other or relative to the multi-core optical sub-module is determined by the high dimensional accuracy realized in the mold die for molding the multi-core optical sub-module, and the relative positional accuracy between the receptacle and the optical connectors is determined by the high dimensional accuracy realized in the mold die (including the core) for molding the receptacle. Therefore, without using such an aligning tool as used conventionally, it is possible to mass-produce multi-core optical modules with a high dimensional accuracy in their finished state with a superior reproducibility, through resin molding. Additionally, such conventional troublesome working of alignment with an expensive aligning tool is unnecessary when the multi-core optical module is mounted on a fixed object such as a printed circuit board, so that it is possible to easily mount the multi-core optical module as it is on the fixed object such as a printed circuit board.

A second embodiment of the present invention will be described with reference to FIGS. 11 to 13.

Figure 11:
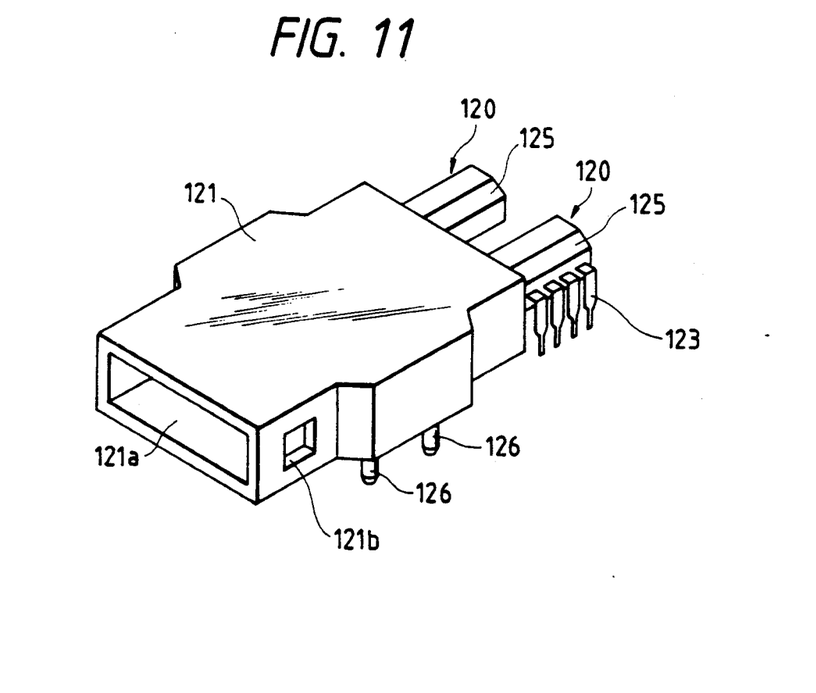
FIG. 11 is a perspective view illustrating a multi-core optical module according to a second embodiment of the present invention applied to a two-core light transmitting/receiving module.
Figure 12:
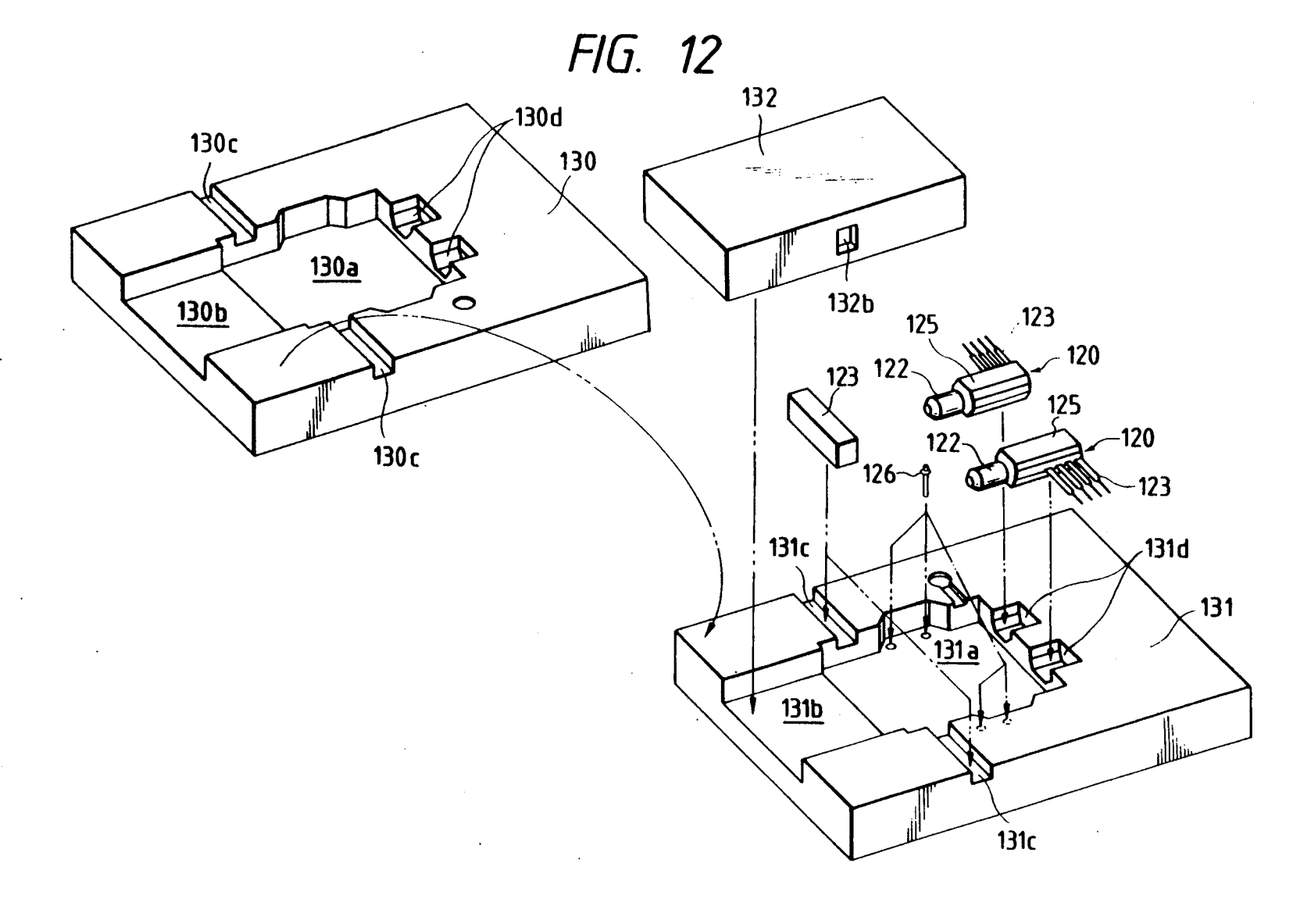
FIG. 12 is an exploded diagram illustrating a receptacle forming mold die used for producing a multi-core optical module.
Figure 13A:
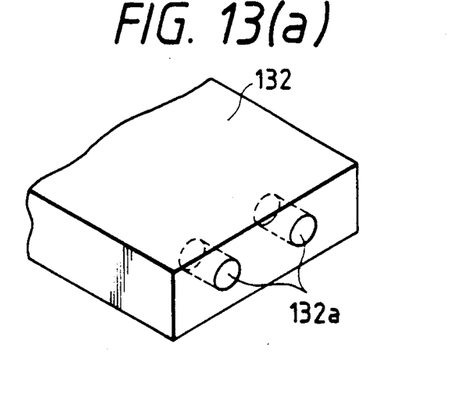
FIG. 13(a) and 13(b) are perspective views illustrating a part of a core of the mold die shown in FIG. 12 for forming an opening portion of a receptacle.
Figure 13B:
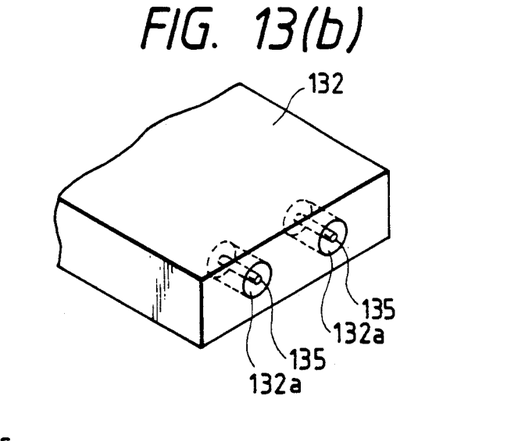

FIG. 11 is a perspective view illustrating a multi-core optical module according to the second embodiment of the present invention applied to a two-core light transmitting/receiving module, and FIG. 12 is an exploded view illustrating a mold die used to form the multi-core optical module.

In the illustrated two-core light transmitting/receiving module shown in FIG. 11, two single-core optical modules 120 are integrally held by a receptacle 121 composed of molding resin. As also shown in FIG. 12, each of the single-core optical sub-modules 120 is formed by integrally holding parts constituting the single-core optical sub-module 120 such as an optical connector 122 and lead pins 123 by a molding resin member 125. Each optical connector 122 is held by the molding resin member 125 in such a manner that the optical connector 122 is projected at its one end by which an end of an optical fiber (not-shown) is received. The two single-core optical sub-modules 120 are held by the receptacle 121 in such a manner that the respective ends of the optical connectors are included in the receptacle 121. In the illustrated embodiment, one of the two single-core optical sub-modules 120 is provided with a light emitting element for light transmission, and the other one is provided with a light receiving element for light reception. However, in the present invention, all single-core optical sub-modules may be for light transmission or for light reception.

In the receptacle 121, an opening portion 121a is formed so as to open at the side opposite to the side at which the receptacle holds the single-core optical sub-modules 120. The respective ends of two optical fibers are held by an optical plug which is to be fitted into the opening portion 121a, so that if the optical plug is fittingly inserted into the opening portion 121a, the respective end portions of the two optical fibers are received by the respective ends of optical connectors enveloped in the receptacle 121 so as to be optically coupled with optical operation elements fixed to the optical connectors. Latch holes 121b are opened in the side portions aside the opening portion 121a, so that when the optical plug is fitted into the opening portion 121a, elastic projections formed at side portions of the optical plug are engaged with those latch holes 121b to thereby prevent the optical plug from coming off from the receptacle 121. Further, stud pins 126 for fixing the receptacle 121 to a printed circuit board or the like are integrally held in the receptacle 121.

Next, the case where the above-mentioned two-core light transmitting/receiving module is produced by use of a mold die shown in FIG. 12, will be described. The illustrated mold die for resin molding the receptacle 121 is constituted by an upper mold 130, a lower mold 131, a core 132 for forming the opening portion, and two cores 133 for forming the latch holes. In the upper and lower molds 130 and 131, there are formed not only recess portions 130a and 131a for forming an outer shape of the receptacle 121, but also core holding portions 130b and 131b for slidably mounting the core 132 therein, and core holding portions 130c and 131c for slidably mounting the cores 133. Further, recess portions 130d and 131d in two pairs for receiving the single-core optical sub-modules 120 are formed respectively. The pairs of recess portions 130d and 131d are formed so as to continue with the recess portions 130a and 130b respectively. The core 132 is mounted in the core holding portions 130b and 131b so as to be held between the upper and lower molds 130 and 131 and so as to project into a cavity formed by the respective recess portions 130a and 131a of the upper and lower molds 130 and 131 to thereby form an inner shape of the receptacle 121. In the end portion of the core 132 projecting into the cavity, fitting holes 132a are formed as shown in FIG. 13(a) so that they can be tightly fitted to the respective ends of the optical connectors 122 respectively provided in the single-core optical sub-modules 120 to thereby hold the optical connectors 122. On the other hand, the cores 133 are mounted in the core holding portions 130c and 131c and engaged with recess portions 132b formed in the side portions of the core 132 to thereby form the latch holes 121b of the receptacle 121 respectively.

When a two-core light transmitting/receiving module is produced through resin molding by use of such a mold die as described above, at first, the single-core optical sub-modules 120 are prepared, the respective ends of the optical connectors 122 provided in the single-core optical sub-modules 120 are fit into the fitting holes 132a of the core 132 respectively, and then the thus assembled core 132 and single-core optical sub-modules 120 are attached to the core holding portions 130b and 131b and the recess portions 130d and 131d of the upper and lower molds respectively. In advance of this, the stud pins 126 are attached to the lower mold 131. Then the cores 133 for forming latch holes are mounted in the core holding portions 130c and 131c respectively, and the inner end portions of the cores 133 are engaged with the respective recess portions 132b of the core 132. Thereafter, plasticized molding resin is injected into the cavity formed by the respective recess portions 130a and 131a of the upper and lower molds to thereby form the receptacle 121 which is holding the two single-core optical sub-modules 120 integrally. Then, the lead pins 123 provided on each of the single-core optical sub-modules 120 are bent into a predetermined shape to thereby obtain a two-core light transmitting/receiving optical module having such a structure that the receptacle 121 is holding the two single-core optical sub-modules 120 integrally as shown in FIG. 11.

In the above-mentioned procedure of resin molding, description has been made such that the single-core optical sub-modules 120 together with the core 132 are attached to the upper and lower molds 130 and 131 after making the core 132 hold the respective ends of the optical connectors 122 provided in the respective single-core optical sub-modules 120. However, the single-core optical sub-modules 120 may be attached to the recess portions 130d and 131d of the respective upper and lower molds 130 and 131 in advance and thereafter the respective ends of the optical connectors 122 provided in the single-core optical sub-modules 120 may be fitted in the fitting holes 132a of the core 132 respectively.

As the molding resin to be injected into the mold die, it is preferable to use poly-phenylene-sulfide (PPS) or epoxy resin having a high dimensional stability.

By the way, in the above described mold die, the two fitting holes 132a are formed in the core 132 as hold portions for holding the respective end portions of the optical connectors 122 provided in the respective single-core optical sub-modules 120 so as to make the core 132 have a function of determining the relative positional relationship between the optical connectors 122 and the relative positional relationship between the opening portion 121a of the receptacle 121 and each of the optical connectors 122. Accordingly, on the basis of the accuracy of the inner size of the fitting holes 132a, the accuracy of the relative positional relationship between the fitting holes 132a, and the accuracy of the outer size of the optical connectors 122, the dimensional accuracy related to the relative positional relationship between the optical connectors 122 and the relative positional relationship between the opening portion 121a of the receptacle 121 and each of the optical connectors 122 are determined. Since it has been possible to obtain optical connectors 122 having high accuracy in size conventionally, after all, the dimensional accuracy on those relative positional relationships depends on the dimensional accuracy in producing the core 132. The technical level of producing mold dies for resin molding including the core 132 and so on has reached the degree possible to realize a very high dimensional accuracy so as to satisfy the dimensional accuracy required in the relative positional relationship between the optical connectors 122 and the relative positional relationship between each of the optical connectors 122 and the receptacle 121. Therefore, without using such an aligning tool as used conventionally, it is possible to mass product two-core light transmitting/receiving modules with a high dimensional accuracy in their finished state having a superior reproducibility by the above-mentioned resin molding. Additionally, a conventional troublesome work of alignment with an expensive aligning tool is unnecessary when a multi-core optical module is mounted on a fixed object such as a printed circuit board, and it is therefore possible to easily mount the multi-core optical module as it is on the fixed object such as a printed circuit board.

In the dimensional accuracy relating to the relative positional relationship between the optical connectors 122 and the relative positional relationship between each of the optical connectors 122 and the opening portion 121a of the receptacle 121, strictness is more required for the dimensional accuracy related to the center axial lines of the inner diameter portions of the optical connectors 122 receiving the respective end portions of the optical fibers rather than for the dimensional accuracy related to the center axial lines of the outer diameters of the connectors 122. In the above-mentioned embodiment, the optical connectors 122 are positioned with reference to their outer diameter center axial lines. Accordingly, if the center axial lines of the outer diameters of the optical connectors do not accord with those of the inner diameters of the same, relative dimensional errors are generated correspondingly between the center axial lines of the inner diameters and between the receptacle opening portion 121a and the center axial lines of the inner diameters. In order to prevent such an error, it is preferable that aligning ferrules 135 tightly fitting into the optical connectors 122 from their ends are provided in the center portions of the fitting holes 132a formed in the core 132, as shown in FIG. 13(b).

In this embodiment, as single-core optical sub-modules, used are not conventional single-core optical sub-modules each obtained by successively assembling constituent parts such as an optical connector on a package of ceramics or the like as shown in FIG. 1, but single-core optical sub-modules in which the constituent parts such as an optical connector are held integrally in molding resin. This is because if the assembling accuracy of the optical connectors 122 relative to the outer size of the single-core optical sub-modules 120 as a whole is low, it is necessary to form the recess portions 130d and 131d receiving single-core optical sub-modules in a mold die more largely in view of the assembling tolerance. Thus, a large space is generated between the conventional single-core optical sub-modules and the mold die, so that a burr is generated at the molding of a receptacle, resulting in undesirable appearance. In order to prevent such a state, therefore, in this embodiment, used are single-core optical sub-modules in each of which the constituent parts such as an optical connector are held integrally in molding resin. In the case where single-core optical sub-modules are formed in such a manner that the constituent parts such as optical connectors are held integrally in molding resin, the single-core optical sub-modules are formed while the end portions of the optical connectors are tightly held by the mold die for forming the single-core optical sub-modules. Accordingly, it is possible to obtain single-core optical sub-module with a high positional accuracy in assembling the optical connectors therein correspondingly to the high dimensional accuracy realized in the mold die.

As has been described above, according to this embodiment of the present invention, the dimensional accuracy between a plurality of optical connectors held integrally in a receptacle and the relative positional accuracy of an opening portion of the receptacle and each of the optical connectors are determined by the high dimensional accuracy realized in a mold die (including a core) used in forming the receptacle.

Therefore, without using such an aligning tool as used conventionally, it is possible to mass produce multi-core optical modules with a high dimensional accuracy in their finished state and with a superior reproducibility, through resin molding. Additionally, a conventional troublesome work of alignment with an expensive aligning tool is unnecessary when a multi-core optical module is mounted on a fixed object such as a printed circuit board, so that it is possible to easily mount the multi-core optical module as it is on the fixed object such as a printed circuit board.

Figure 14:
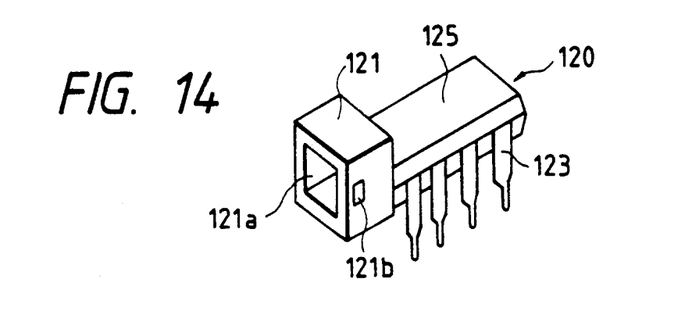
FIGS. 14, 15 and 16 are perspective views illustrating optical modules according to a third, a fourth and a fifth embodiments of the present invention, respectively.
Figure 15:
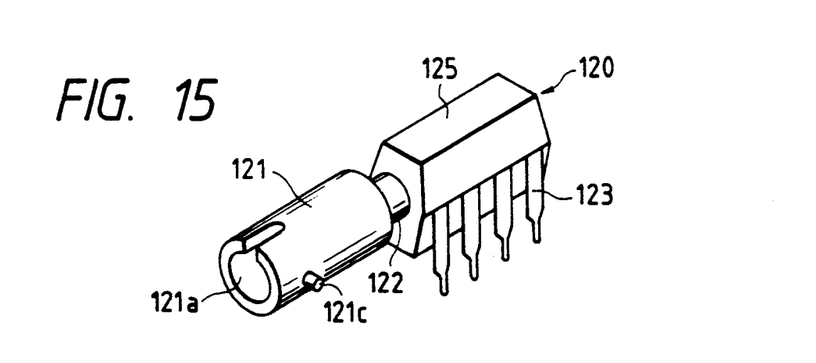
Figure 16:
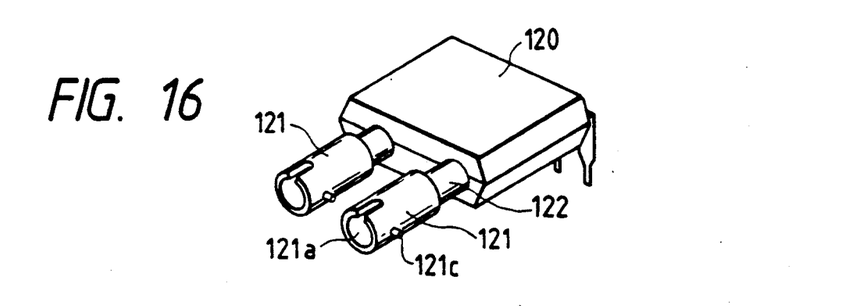

Although the above described embodiments relate to two-core optical modules, it is needless to say that the present invention is also applicable to a single-core optical module as shown in FIGS. 14 and 15 in addition to a multi-core optical module having more than three optical connectors. In FIG. 14, a receptacle 121 integrally holds a single-core optical sub-module 120 to envelope the entire portion of an optical connector (third embodiment). In FIG. 15, a receptacle 121 integrally holds a single-core optical sub-module 120 to envelop a portion of the optical connector 122 (fourth embodiment). Further, in FIG. 15, a latch projection 121c is provided instead of a latch hole 121b in FIG. 14. FIG. 16 shows an optical module according to a fifth embodiment of the present invention, in which a plurality of receptacles 121 integrally hold a multi-core optical sub-module 20 such that each of the receptacles envelopes a portion of each of optical connectors 22.

What is claimed is:

1. An optical module comprising:

an optical sub-module member having an optical connector means, said optical connector means including an optical operation element and an end portion, said end portion of said optical connector means including means for receiving an optical fiber so as to optically couple said optical fiber with said optical operation element, said optical connector means integrally held by a molded resin member except for said end portion of said optical connector means; and a receptacle means for enveloping said end portion of said optical connector means to integrally hold said optical sub-module member, said receptacle means including an opening portion operatively associated with an optical plug, said optical plug holding said end portion of said optical fiber, said optical fiber to be received by said optical connector means.

2. An optical module as claimed in claim 1, wherein said optical sub-module member comprises a single optical sub-module having a plurality of optical connector means, and wherein said receptacle means holds said optical sub-module integrally so as to envelope the entirety of said optical connector means.

3. An optical module as claimed in claim 1, wherein said optical sub-module member comprises a plurality of optical sub-modules each having an optical connector means, and wherein said receptacle means holds said optical sub-modules integrally so as to envelope the entirety of said optical connector means.

4. An optical module as claimed in claim 1, wherein said optical sub-module member comprises a single optical sub-module having an optical connector means, and wherein said receptacle means holds said optical sub-module integrally so as to envelope the entirety of said optical connector means.

5. An optical module as claimed in claim 1, wherein said optical sub-module member comprises a single optical sub-module having an optical connector means, and wherein said receptacle means holds said optical sub-module integrally so as to envelope a portion of said optical connector means.

6. An optical module as claimed in claim 1, wherein said receptacle means comprises a plurality of receptacles and said optical sub-module member comprises a single optical sub-module having a plurality of optical connector means, and wherein said receptacles integrally hold said optical sub-module such that each of said receptacles envelopes a portion of each of said optical connector means.

7. An apparatus for producing an optical module as claimed in claim 1, comprising:

a mold die for resin-molding said receptacle means; wherein said mold die includes a core for forming said opening portion, said core having at least one hold portion formed in said core for holding a portion of said optical sub-module member.

8. An apparatus as claimed in claim 7, wherein said hold portion holds said molded resin member of said sub-module member.

9. An apparatus as claimed in claim 7, wherein said hold portion holds said end portion of said optical connector means of said sub-module member.

10. An apparatus as claimed in claim 7, wherein said hold portion includes at least one aligning ferrule.

11. A method of producing an optical module, comprising the steps of:

forming an optical sub-module member including an optical connector means having an end portion for receiving an optical fiber member, and having an optical operation element, so that said optical connector means is held except for said end portion by molding resin constituting a molded resin member, said end portion of said optical connector means so disposed so as to optically couple said optical fiber member with said optical operation element;

forming, through resin molding, a receptacle means for enveloping said end portion of said optical connector means to hold said optical sub-module member, said receptacle means including an opening portion operatively associated with an optical plug, said optical plug holding said optical fiber member to be received by said optical connector means.

12. A method of producing an optical module as claimed in claim 11, wherein said optical sub-module member comprises a single optical sub-module having a plurality of optical connector means, and wherein said receptacle means holds said optical sub-module integrally so as to envelope the entirety of said optical connector means.

13. A method of producing an optical module as claimed in claim 11, wherein said optical sub-module member comprises a plurality of optical sub-modules each having an optical connector means, wherein said receptacle means holds said optical sub-modules integrally so as to envelope the entirety of said optical connector means.

14. A method of producing an optical module as claimed in claim 11, wherein said optical sub-module member comprises a single optical sub-module having an optical connector means, wherein said receptacle means holds said optical sub-module integrally so as to envelope the entirety of said optical connector means.

15. A method of producing an optical module as claimed in claim 11, wherein said optical sub-module member comprises a single optical sub-module having an optical connector, wherein said receptacle means holds said optical sub-module integrally so as to envelope a portion of said optical connector means.

16. A method of producing an optical module as claimed in claim 11, wherein said receptacle means comprises a plurality of receptacles and said optical sub-module member comprises a single optical sub-module having a plurality of optical connector means, wherein said receptacles integrally hold said optical sub-module such that each of said receptacles envelopes a portion of each of said optical connector means.

17. A method of producing an optical module as claimed in claim 11, wherein said receptacle means is formed through a mold die including a core for forming said opening portion, said core having at least one hold portion formed in said core for holding a portion of said optical sub-module member.

18. A method of producing an optical module as claimed in claim 17, wherein said hold portion holds said molded resin member of said sub-module member.

19. A method of producing an optical module as claimed in claim 17, wherein said hold portion holds said end portion of said optical connector means of said sub-module member.

20. A method of producing an optical module as claimed in claim 17, wherein said hold portion includes at least one aligning ferrule.

* * * * *